(12) United States Patent
Chavali

(10) Patent No.: US 7,155,656 B1
(45) Date of Patent: Dec. 26, 2006

(54) METHOD AND SYSTEM FOR DECODING OF BINARY SHORTENED CYCLIC CODE

(75) Inventor: Nanda Kishore Chavali, Andhra Pradesh (IN)

(73) Assignee: Hellosoft Inc., San Jose, CA (US)

( * ) Notice: Subject to any disclaimer, the term of this patent is extended or adjusted under 35 U.S.C. 154(b) by 594 days.

(21) Appl. No.: 10/427,538

(22) Filed: May 1, 2003

(51) Int. Cl.
*H03M 13/17* (2006.01)

(52) U.S. Cl. .................... 714/762; 714/785

(58) Field of Classification Search ........... 714/762, 714/785
See application file for complete search history.

(56) References Cited

U.S. PATENT DOCUMENTS

| | | | | |
|---|---|---|---|---|
| 4,059,825 A | * | 11/1977 | Greene | 714/762 |
| 4,566,105 A | * | 1/1986 | Oisel et al. | 714/756 |
| 4,584,686 A | * | 4/1986 | Fritze | 714/784 |
| 4,698,813 A | * | 10/1987 | Erdel | 714/762 |
| 5,107,506 A | * | 4/1992 | Weng et al. | 714/762 |
| 5,140,595 A | * | 8/1992 | Geldman et al. | 714/762 |
| 5,381,423 A | * | 1/1995 | Turco | 714/762 |
| 5,657,331 A | * | 8/1997 | Metzner et al. | 714/762 |
| 5,936,978 A | * | 8/1999 | Ramesh et al. | 714/762 |
| 6,427,219 B1 | * | 7/2002 | Yang | 714/758 |
| 6,754,871 B1 | * | 6/2004 | Pines et al. | 714/762 |

OTHER PUBLICATIONS

Blahut, R. E., Theory and Practice of Error Control Codes, May 1984, Addison-Wesley Pub. Co., pp. 147-156.*
Advanced Micro Devices, MOS Microprocessors and Peripherals 1985 Data Book, Am9520/Am9521/AmZ8065 Burst Error Processor, pp. 2-489 to 2-499.*

* cited by examiner

*Primary Examiner*—Stephen M. Baker
(74) *Attorney, Agent, or Firm*—William L. Botjer

(57) ABSTRACT

A computationally efficient method and system for decoding shortened cyclic codes is presented. The increase in computational efficiency is achieved by improvement of the syndrome calculation step. Two embodiments of the present invention are described; the first embodiment is optimized for a hardware implementation and the second embodiment is optimized for a Digital Signal Processor (DSP) implementation. The present invention is applicable to decoding of all the binary shortened cyclic codes, including Fire codes used for Coding Scheme-1 (CS-1) for GSM.

20 Claims, 5 Drawing Sheets

METHOD AND SYSTEM FOR DECODING OF BINARY SHORTENED CYCLIC CODE

BACKGROUND

The present invention relates to the field of error-control coding, and more specifically with error correction using binary shortened cyclic codes.

Data transmission over a channel is prone to errors due to numerous factors such as fading, channel noise and signal interference. These errors cause the receiver to obtain a corrupted form of the transmitted signal. A variety of error-control coding schemes have been proposed to perform error-detection and error-correction. The underlying principle of all of these schemes is to add redundancy to the transmitted data such that the errors during transmission may be detected and corrected. The schemes select a code-word for every message-word to be transmitted. The selected code-word represents the data of the message-word and additionally has a redundant data component, which is used for error-control. The amount of redundancy added is a function of the error-control capability of the scheme. At the receiver, a corrupted form of the transmitted code-word is received. However, if the errors in the received code-word are within the error-control capability of the scheme, the receiver can determine the correct message-word corresponding to the received code-word.

One of the most prevalent error-control coding schemes used today is the cyclic code. A (n,k) cyclic code encodes message-words of length k bits into code-words of length n bits. The basic property of a cyclic code is that the result of a cyclic shift operation performed on one code-word of the cyclic code yields another code-word of the cyclic code. Mathematically, for every code-word $C=(c_0, c_1, \ldots, c_{n-1})$, the result of a right cyclic shift operation i.e. $C^1=(c_{n-1}, c_0, \ldots, c_{n-2})$ is also a code-word. These code-words are obtained from the message-words using a generator $g(x)$ associated with the cyclic code. The generator of degree $n-k$ uniquely defines the cyclic code and is mathematically represented as:

$$g(x)=1+g_1 x+g_2 x^2+\ldots+g_{n-k-1}x^{n-k-1}+x^{n-k}$$

where, $g_1$ to $g_{n-k-1}$ are referred to as the coefficients of the generator.

The encoding and the decoding operations of a cyclic code can be achieved through the use of Linear Feedback Shift Registers (LFSRs). The encoding process using cyclic codes produces an n bit code-word containing the k bit message-word and n–k additional parity bits. The parity bits are computed using an LFSR that has its feedback connections weighted by the coefficients of the generator of the cyclic code. The k bits of the message-word are sequentially fed into the LFSR. Once the whole message-word has been fed into the LFSR, the contents of the LFSR define the parity bits. The n bit code-word thus produced contains k bits of the message-word followed by n–k parity bits. An implementation of an encoder for cyclic codes using an LFSR is described in the 4th edition of "Communication Systems" by Simon Haykin, published by John Wiley and Sons, Inc.

The decoding of the corrupted code-word to remove a burst error pattern involves the following steps. First, an n–k bit syndrome corresponding to the corrupted code-word is calculated. The syndrome is characteristic of the burst error pattern present in the corrupted code-word. The importance of the syndrome lies in the fact that it depends only on the burst error pattern, and not on the code-word itself. Hence, the syndrome is subsequently used to identify the burst error pattern present in the corrupted code-word through a process known as error-trapping. The error-trapping algorithms assume that a burst error is present in the corrupted code-word. A burst error of at most b bits is correctable by the cyclic code, where b is the error-control capability of the cyclic code. Once the b bit error pattern is identified, a corresponding correction is applied to the corrupted code-word to correct the error and obtain the original transmitted code-word.

An advantage of cyclic codes is that their encoding process is simple. Further, cyclic codes possess a well-defined mathematical structure, which has led to the development of very efficient decoding schemes for them. A method for decoding of cyclic codes is described in the European Patent Office (EPO) patent application number EP 1,274,173 A2, titled "Error Trapping And Correction For Cyclic Codewords" of Matsushita Electric Industrial Co., Ltd.

However, one of the major drawbacks of cyclic codes is that it is not always possible to find a suitable cyclic code for the desired length of the message-word. A way of overcoming this is to select a cyclic code suitable for use with a message-word of length greater than the desired length of the message-word. In this case, a zero-portion is added to the message-word to increase its length to the length used by the cyclic code. However, this solution turns out to be wasteful in terms of complexity of the decoders, as well as in terms of the bandwidth used for transmission. This problem is a major concern if the size of the zero-portion is large. For instance, in the European Global System for Mobile Communications (GSM) protocol, a message-word of length 184 bits is required to be transmitted with 40 additional parity bits. However, for selection of a suitable cyclic code, a zero-portion of 3014409 bits needs to be added to this message-word.

To minimize the waste incurred due to the zero-portion, a special class of cyclic codes, called shortened cyclic codes, is used. A (n–l, k–l) shortened cyclic code encodes a message-word of length k–l bits into a code-word of length n–l bits wherein the zero-portion of the message-word is of length l bits. A shortened cyclic code does not have the properties of a cyclic code, but it uses the properties applicable to a (n,k) cyclic code for the encoding and the decoding process. GSM uses a special class of shortened cyclic codes called Fire codes. The Fire coding method used for GSM selects a code-word of length 224 bits to represent the message-word of length 184 bits and uses a zero-portion of 3014409 bits. Thus, the Fire code used in GSM is a (3014633-3014409, 3014593-3014409) shortened cyclic code. However, a major drawback of the already available shortened cyclic code decoders is the complexity of the syndrome calculation operation.

Some approaches for decoding of shortened cyclic codes have been suggested in the prior art to reduce the computational complexity of syndrome calculation. One such approach is described in the U.S. Pat. No. 5,936,978 titled "Shortened Fire Code Error-Trapping Decoding Method And Apparatus" assigned to Telefonaktiebolaget L M Ericsson, Stockholm, Sweden. However, the approach described in this patent requires the knowledge of inverse cyclic codes. Further, the approach requires considerable amount of hardware for implementation.

Thus, there is a need for a simpler approach for decoding of binary shortened cyclic codes, which requires lesser hardware for implementation.

SUMMARY

The present invention is directed to a method and system that performs error-correction decoding for code-words encoded using shortened cyclic codes.

An objective of the present invention is to reduce the computational complexity of decoding of shortened cyclic codes.

Another objective of the present invention is to improve the computational efficiency of syndrome computation for decoding of shortened cyclic codes.

Still another objective of the present invention is to reduce the hardware complexity of circuits used for syndrome computation for decoding of shortened cyclic codes.

To achieve the foregoing objectives, and in accordance with the purpose of the present invention as broadly described herein, the present invention provides a method and system to decode shortened cyclic codes. The improvement in the computational efficiency and the reduction in the hardware complexity are achieved by the novel method of syndrome computation. Two embodiments of the present invention are described. The first embodiment is more suitable for hardware implementation using Linear Feedback Shift Register (LFSR) circuits. The second embodiment is better suited for implementation using a Digital Signal Processor (DSP).

BRIEF DESCRIPTION OF THE DRAWINGS

The preferred embodiments of the invention will hereinafter be described in conjunction with the appended drawings provided to illustrate and not to limit the invention wherein like designations denote like elements, and in which.

DESCRIPTION OF PREFERRED EMBODIMENTS

Figure 1:
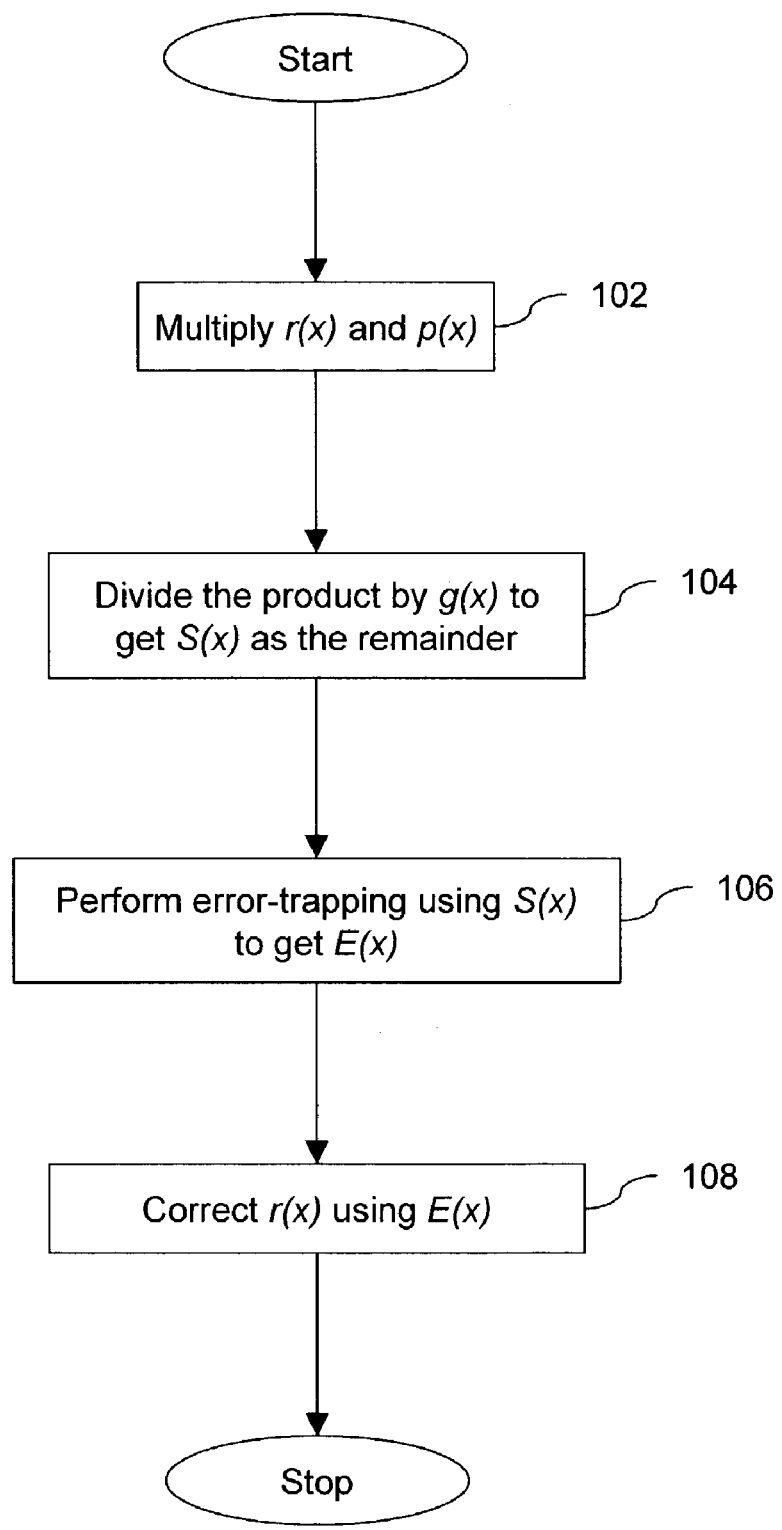
FIG. 1 is a flow-chart for decoding a shortened cyclic code code-word in accordance with the first embodiment of the present invention.

The present invention provides a computationally efficient and a less complex method of syndrome calculation for the decoding of shortened cyclic codes. The method is suitable for use with all binary shortened cyclic codes, in general, and with the Fire codes used for Coding Scheme-1 (CS-1) for GSM, in particular. The increase in the computational efficiency and the reduction in the complexity over prior art methods is achieved by the method of syndrome computation.

The present invention is embodied in two distinct forms as described hereinafter. The first embodiment of the present invention is better suited for hardware implementation (using an LFSR circuit), i.e. the hardware implementation of the first embodiment costs less than the hardware implementation of the second embodiment.

The second embodiment of the present invention is more suitable for implementation using a DSP, i.e. the software implementation of the second embodiment is faster (computationally less complex) than the software implementation of the first embodiment.

The two embodiments are hereinafter described in detail. For the mathematical description below, vectors are represented as polynomials wherein an n bit vector $m=(m_0, m_1, \ldots, m_{n-1})$ is represented as a polynomial $m(x)$ and vice versa, and where $m(x)$ is defined as follows:

$$m(x) = m_0 + m_1 x + m_2 x^2 + \ldots + m_{n-1} x^{n-1} \quad \text{(Equation 1)}$$

Consider a communication system in which the information bits are encoded using a (n–l, k–l) shortened cyclic code. The receiver receives a corrupted code-word, represented by polynomial $r(x)$ of length n–l bits, from the channel. The unshortened code-word corresponding to this, $R(x)$, is given by:

$$R(x) = x^l * r(x) \quad \text{(Equation 2)}$$

Equation 2 shows a multiplication operation for right-shifting corrupted code-word $r(x)$ by l bits to obtain unshortened code-word $R(x)$, wherein $x^l$ is a shift polynomial of order l, and '*' is the multiplication operator.

In accordance with the decoding of cyclic codes, the syndrome is calculated as:

$$S(x) = R(x) \bmod g(x) \quad \text{(Equation 3)}$$

where, the mod operator gives the remainder left on dividing the identity to its left by the identity to its right and where $g(x)$ is the generator of the cyclic code and $S(x)$ is the syndrome corresponding to $R(x)$.

Equation 3 may be rewritten as:

$$R(x) = a_1(x) * g(x) + S(x) \quad \text{(Equation 4)}$$

where, $a_1(x)$ is the quotient obtained on dividing $R(x)$ by $g(x)$.

Now consider a syndrome-calculation polynomial $p(x)$ obtained as the remainder left on dividing $x^l$ by $g(x)$. This is mathematically represented as:

$$p(x) = x^l + a_2(x) * g(x) \quad \text{(Equation 5)}$$

where, $a_2(x)$ is the quotient obtained on dividing $p(x)$ by $g(x)$.

Multiplying Equation 5 with $r(x)$ and using Equation 4 gives the result:

$$p(x) * r(x) = [a_1(x) + a_2(x)] * g(x) + S(x) \quad \text{(Equation 6)}$$

Equation 6 forms the mathematical basis for the present invention.

Referring now primarily to FIG. 1, the algorithm for decoding a shortened cyclic code code-word in accordance with the first embodiment of the present invention is hereinafter described. At step 102, corrupted code-word polynomial $r(x)$ is multiplied with syndrome-calculation polynomial $p(x)$. Then at step 104, the product of $p(x)$ and $r(x)$ is divided by generator $g(x)$ to obtain syndrome $S(x)$ as the remainder. Following this, at step 106, error-trapping is performed using syndrome $S(x)$ to get a burst-error $E(x)$. The method for performing error-trapping is described later with reference to FIG. 3. Finally, at step 108, the corrupted code-word polynomial $r(x)$ is corrected using burst-error $E(x)$. In a preferred embodiment of the present invention, step 108 is performed using modulo-2 addition of the coefficient vector of burst-error $E(x)$ and the erroneous bits of the coefficient vector of $r(x)$. It would be apparent to anyone skilled in the art that besides error-trapping, several other methods for correcting the corrupted code-word using the syndrome may be used without deviating from the spirit and scope of the present invention.

In a preferred embodiment of the present invention, the multiplication at step 102 and the division at step 104 are performed simultaneously using an LFSR circuit. One implementation of such an LFSR circuit for simultaneous multiplication and division is presented in Chapters 4 and 9 of "Error Control Coding: Fundamentals and Applications" by Shu Lin and Daniel J. Costello, Jr, published by Prentice-Hall, Inc. in 1983.

The first embodiment of the present invention is the preferred embodiment for implementation using an LFSR circuit. The second embodiment of the present invention is optimized for DSP implementation. The mathematical basis for the second embodiment is now described.

Let $s(x)$ denote the shortened syndrome of corrupted code-word $r(x)$. This is mathematically represented as:

$$r(x)=a_3(x)*g(x)+s(x) \quad \text{(Equation 7)}$$

where, $a_3(x)$ is the quotient obtained on dividing $r(x)$ by $g(x)$.

Further, the syndrome corresponding to corrupted code-word $r(x)$ may be obtained as:

$$x^l*r(x)=a_4(x)*g(x)+S(x) \quad \text{(Equation 8)}$$

Substituting Equation 7 in Equation 8, the result obtained is:

$$x^l*[a_3(x)*g(x)+s(x)]=a_4(x)*g(x)+S(x) \quad \text{(Equation 9)}$$

Equation 9 may be simplified as follows:

$$x^l*s(x)=a_5(x)*g(x)+S(x) \quad \text{(Equation 10)}$$

where, $a_5(x)=x^l*a_3(x)+a_4(x)$.

By multiplying both the sides of Equation 5 with $s(x)$ and using Equation 10, the result obtained is:

$$p(x)*s(x)=a_6(x)*g(x)+S(x) \quad \text{(Equation 11)}$$

where, $a_6(x)=a_2(x)*s(x)+a_5(x)$.

Equation 11 forms the mathematical basis of the second embodiment for the present invention.

Figure 2:
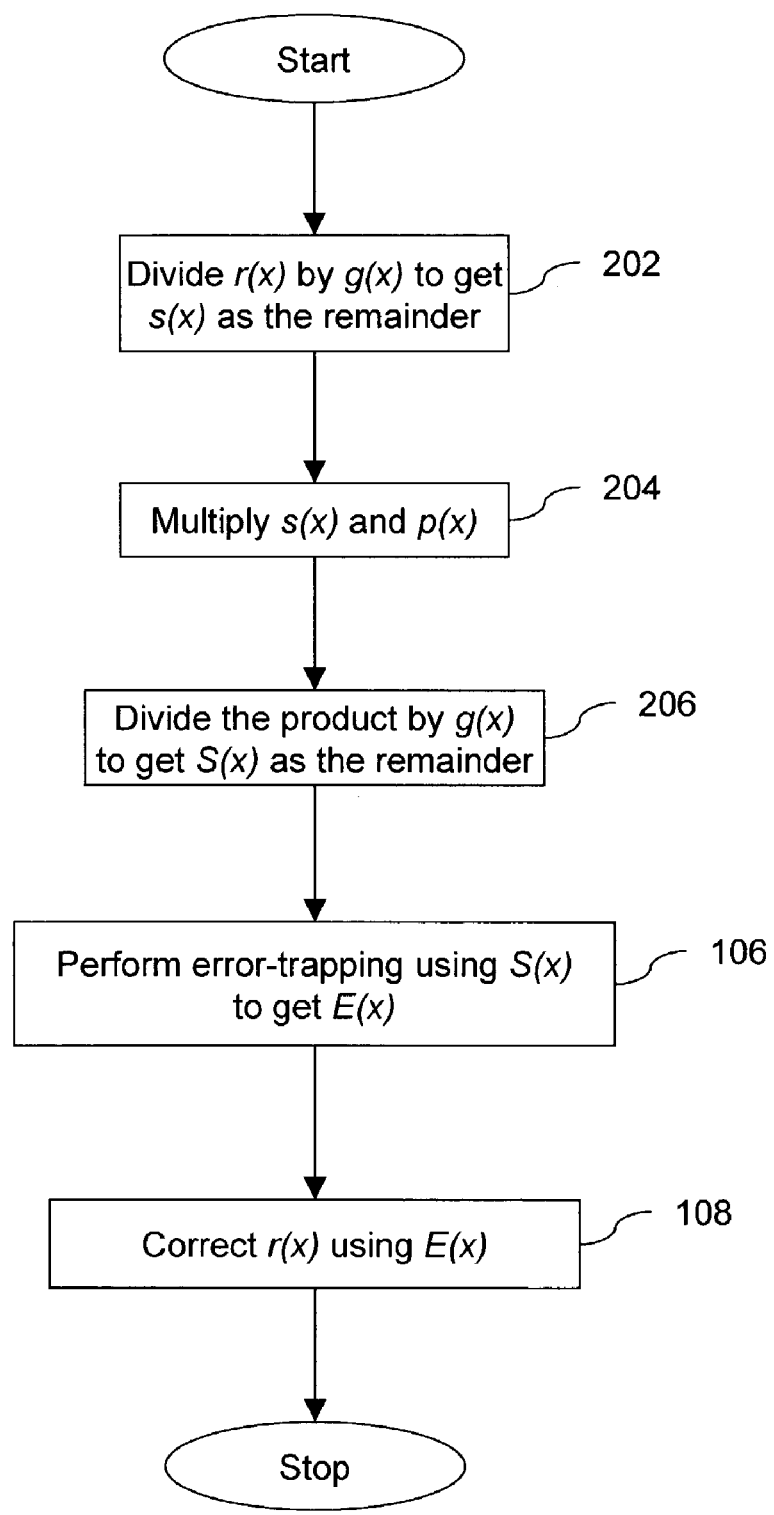
FIG. 2 is a flow-chart for decoding a shortened cyclic code code-word in accordance with the second embodiment of the present invention.

Referring now primarily to FIG. 2, the method for decoding a shortened cyclic code code-word in accordance with the second embodiment of the present invention is hereinafter described. At step 202, corrupted code-word $r(x)$ is divided by generator $g(x)$ to obtain shortened syndrome $s(x)$ as the remainder. Then at step 204, shortened syndrome $s(x)$ is multiplied with syndrome-calculation polynomial $p(x)$. Subsequently, at step 206, the product of $s(x)$ and $p(x)$ obtained at step 204 is divided by generator $g(x)$ to obtain syndrome $S(x)$ as the remainder. Thereafter, at step 106, syndrome $S(x)$ obtained at step 206 is used to perform error-trapping and obtain burst-error $E(x)$. Finally, at step 108, burst-error $E(x)$ obtained at step 106 is used to correct corrupted code-word $r(x)$.

Figure 3:
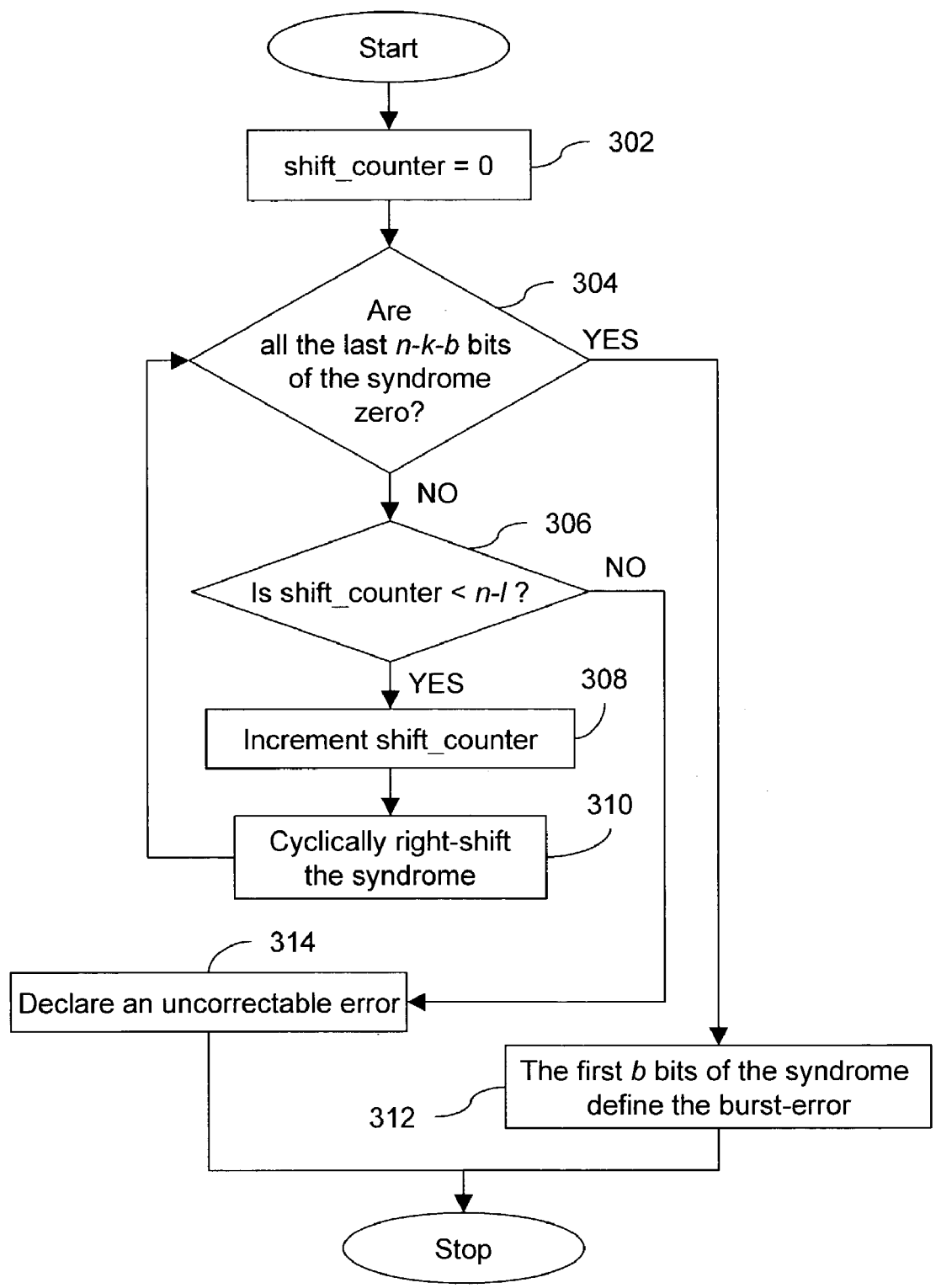
FIG. 3 is a flow-chart for error-trapping using the syndrome corresponding to the corrupted code-word.

Referring now primarily to FIG. 3, the method used for error-trapping using the syndrome corresponding to the corrupted code-word is hereinafter described. At step 302, a shift_counter is initialized to zero. Then, at step 304, the last n–k–b bits of the syndrome $S(x)$ are checked, where b is the burst error correction capability of the (n–l, k–l) shortened cyclic code. If all the last n–k–b bits of the syndrome $S(x)$ are not zero, then at step 306, the value of the shift_counter is compared to n–l. If the shift_counter is found to be less than n–l, then at step 308, the value of the shift_counter is incremented by one. Thereafter, at step 310, the syndrome $S(x)$ is cyclically right-shifted by one position using an LFSR and the new contents of the syndrome $S(x)$ are used for performing step 304 again.

The contents of the syndrome $S(x)$ are repeatedly cyclically right-shifted using an LFSR until at step 304, all the last n–k–b bits of the syndrome $S(x)$ are found to be zero. Thereafter, at step 312, the first b bits of the syndrome $S(x)$ are identified as burst-error $E(x)$. However, if the syndrome $S(x)$ is cyclically right-shifted using an LFSR n–l times, with at least one of its last n–k–b bits being non-zero each time, then at step 306, the shift_counter value exceeds n–l. This implies that the length of the burst error is greater than b, the error correcting capability of the code. This implies that the error in the corrupted code-word can not be corrected by the code. Hence, at step 314, the occurrence of an uncorrectable error is declared.

Figure 4:
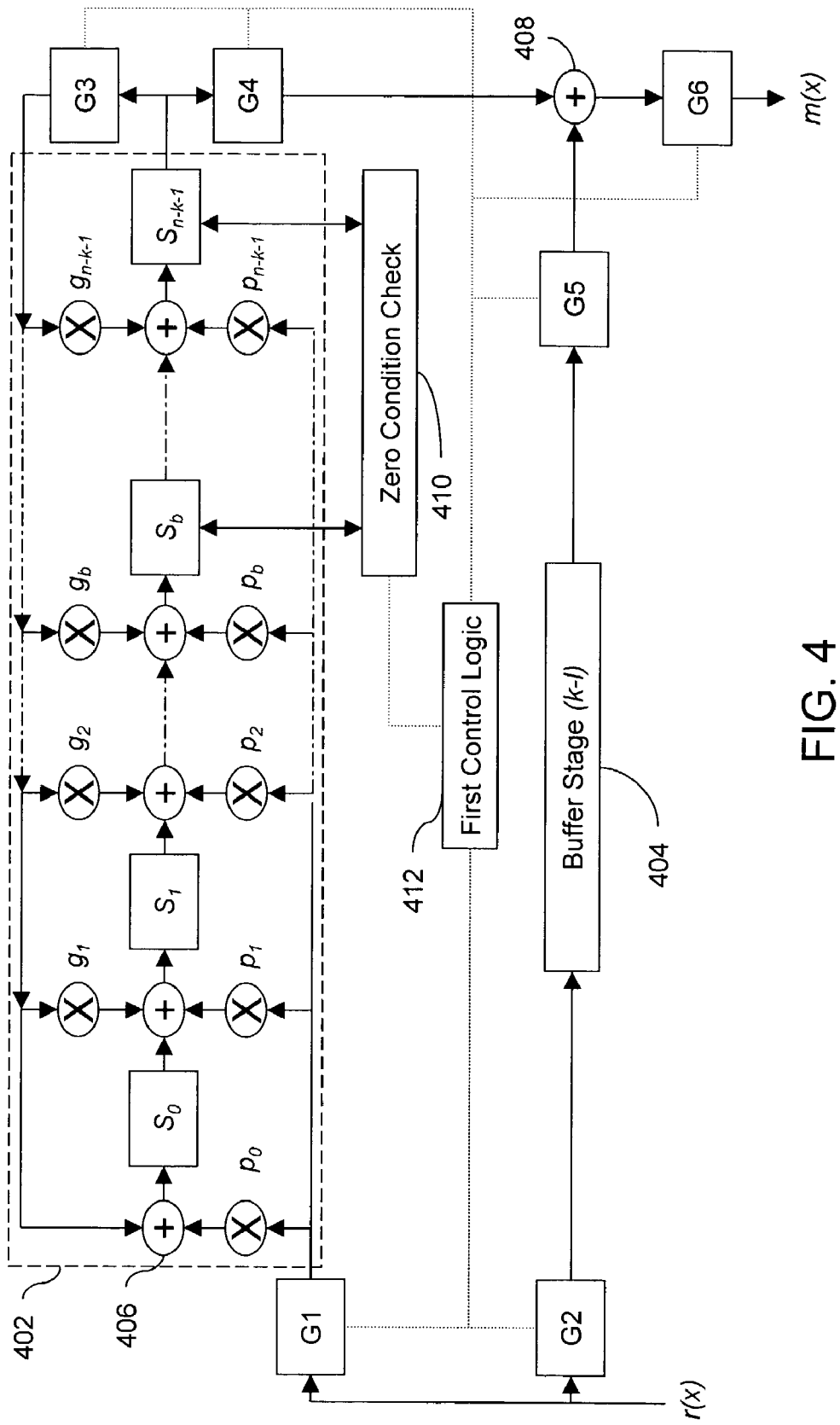
FIG. 4 illustrates a system for decoding a shortened cyclic code code-word in accordance with the first embodiment of the present invention.

Referring now primarily to FIG. 4, a system for decoding a shortened cyclic code code-word in accordance with the first embodiment of the present invention is hereinafter described. The figure shows corrupted code-word $r(x)$ being fed into a gate G1 and a gate G2. Gate G1 is further connected to a multiplication and division LFSR circuit 402 for performing simultaneous multiplication and division. The output of gate G2 is connected to a Buffer Stage 404 for storing the first k–l bits of corrupted code-word $r(x)$.

Multiplication and division LFSR circuit 402 comprises a syndrome register, an array of multipliers weighted by the coefficients of syndrome-calculation polynomial $p(x)$ ($p_0$ to $p_{n-k-1}$), an array of multipliers weighted by the coefficients of the generator $g(x)$ ($g_1$ to $g_{n-k-1}$), and an array of modulo-2 adders 406. The syndrome register further comprises n–k flip-flops $S_0$ to $S_{n-k-1}$ for storing the n–k bits of syndrome $S(x)$. The output of gate G1 is fed to multipliers $p_0$ to $p_{n-k-1}$, and the outputs of multipliers $p_0$ to $p_{n-k-1}$ are further fed to modulo-2 adders 406 as shown in the figure. Modulo-2 adders 406 connect the output of each flip-flop to the input of the subsequent flip-flop. The most significant bit of syndrome $S(x)$, $S_{n-k-1}$, is fed to multipliers $g_1$ to $g_{n-k-1}$ through a gate G3, and the outputs of multipliers $g_1$ to $g_{n-k-1}$ are fed to modulo-2 adders 406 in a feedback loop as shown in the figure.

The output of flip-flop $S_{n-k-1}$ is fed to an error-correction modulo-2 adder 408 through a gate G4. The second input of error-correction modulo-2 adder 408 is taken from the output of Buffer Stage 404 through a gate G5. The output of error-correction modulo-2 adder 408 is fed to a gate G6, which outputs a decoded message-word $m(x)$.

For the error-trapping operation, a Zero Condition Checker 410 checks whether all the last n–k–b bits of syndrome $S(x)$, $S_b$ to $S_{n-k-1}$, are zero. The result of this check is fed to a First Control Logic 412 that controls the decoding process by turning gates G1 to G6 ON or OFF as explained hereinafter.

The decoding process is performed in four stages. In the first stage, multiplication and division LFSR circuit 402 is used for computation of syndrome $S(x)$ while the first k–l bits of corrupted code-word $r(x)$ are pushed into Buffer Stage 404. For this phase, gates G1, G2 and G3 are turned ON and all the other gates are turned OFF. The first k–l bits of corrupted code-word $r(x)$ are pushed sequentially into multiplication and division LFSR circuit 402 through gate G1. At the same time, these k–l bits are also pushed into Buffer Stage 404 through gate G2. As gate G3 is ON in this phase, the feedback connections through multipliers $g_1$ to $g_{n-k-1}$ are enabled.

Subsequently, at the second stage of the decoding process, gate G2 is turned OFF while gates G1 and G3 remain ON. In this stage, the last n–k bits of corrupted code-word $r(x)$ are pushed into multiplication and division LFSR circuit 402 through gate G1. This completes the computation of syndrome S(x), the value of which is now contained in flip-flops $S_0$ to $S_{n-k-1}$.

At the third stage of the decoding process, error-trapping is performed using syndrome S(x). For this, gate G1 is turned OFF but gate G3 is left ON. Multiplication and division LFSR circuit 402 cyclically right-shifts syndrome S(x) as described with reference to FIG. 1, and the number of cyclic right-shift operations applied is counted by the shift_counter maintained by First Control Logic 412. The last n−k−b bits of the contents of multiplication and division LFSR circuit 402 are checked by Zero Condition Checker 410 after each cyclic right-shift operation. The process of shifting and checking is repeated till Zero Condition Checker 410 alerts First Control Logic 412 that the last n−k−b bits of the contents of multiplication and division LFSR circuit 402 are zero. This implies that the burst error is trapped in the first b bits of multiplication and division LFSR circuit 402. These b bits define burst-error E(x).

Thereafter, at the fourth stage of the decoding operation, error-correction is performed. For this, gate G3 is turned OFF and the b bits of burst-error E(x) are shifted to the last b bits of multiplication and division LFSR circuit 402. Then, the value of the shift_counter maintained by First Control Logic 412 is used to identify the location of the corrupted bits in corrupted code-word r(x). For this, First Control Logic 412 compares the value of the shift_counter with k−l.

If the value of the shift_counter is greater than k−l, it is concluded that the error has occurred in the parity bits of corrupted code-word r(x) and the bits of message-word m(x) in corrupted code-word r(x) are not corrupted. In this case, the contents of Buffer Stage 404 are identified as message-word m(x) and output through gate G6 by turning gates G5 and G6 ON.

However, if the value of the shift_counter is found to be less than k−l, the error is concluded to have occurred in the bits of message-word m(x) in corrupted code-word r(x). In this case, the first shift_counter number of bits of Buffer Stage 404 is identified as uncorrupted. These bits are output through gate G6 by turning gates G5 and G6 ON while keeping G4 OFF. After this gate G4 is turned on to correct the next b bits of Buffer Stage 404, or the remaining bits of Buffer Stage 404, whichever is lesser. The turning ON of gate G4 enables error-correction modulo-2 adder 408 to correct the bits of Buffer Stage 404 by performing modulo-2 addition of the bits of Buffer Stage 404 with burst-error E(x).

After the correction, gate G4 is turned OFF again, and the remaining bits, if any, in Buffer Stage 404 are pushed out through gates G5 and G6.

Figure 5:
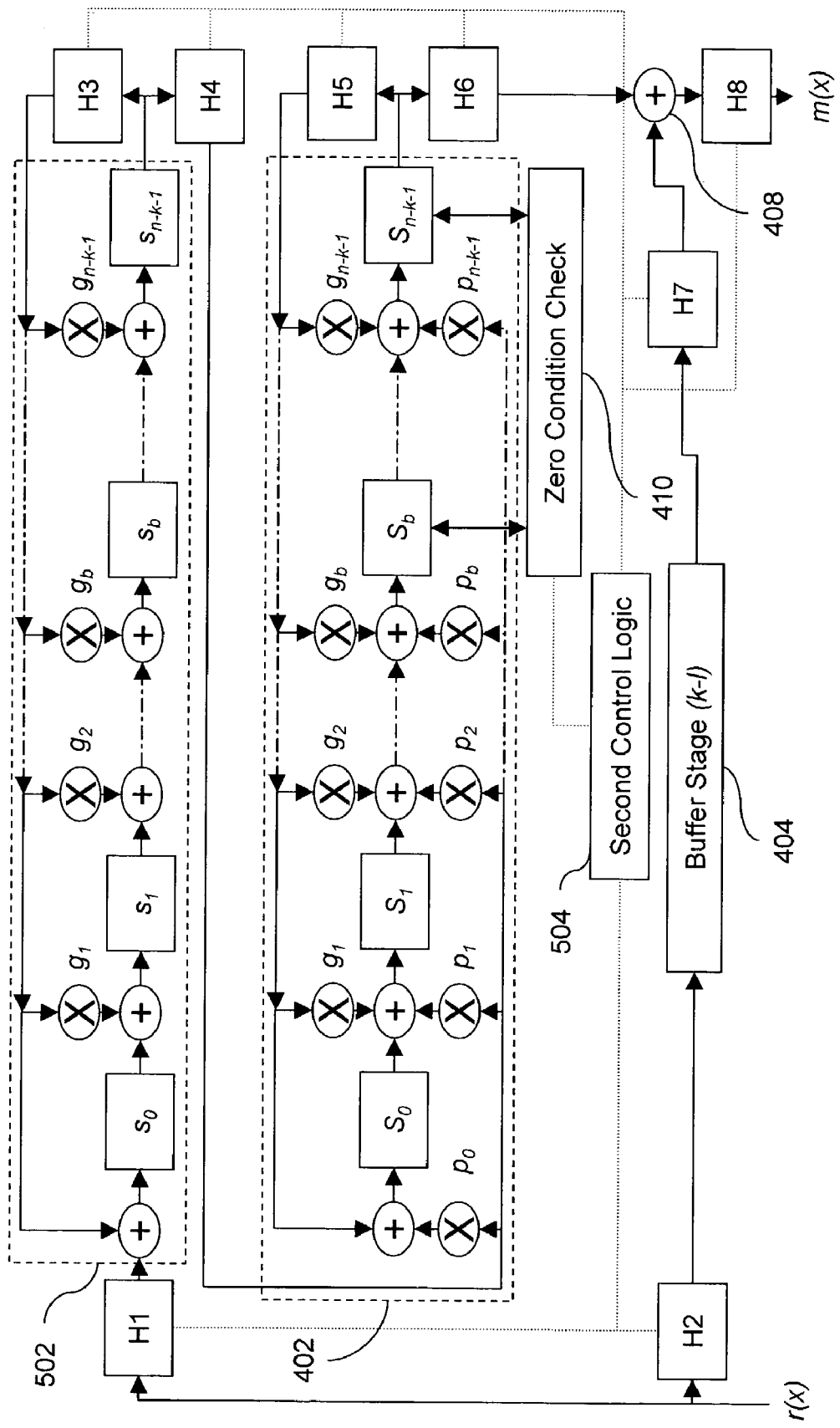
FIG. 5 illustrates a system for decoding a shortened cyclic code code-word in accordance with the second embodiment of the present invention.

Referring now primarily to FIG. 5, a system for decoding a shortened cyclic code code-word in accordance with the second embodiment of the present invention is hereinafter described. The preferred implementation of the second embodiment is using a DSP. The DSP implementation of the second embodiment may be reduced to practice using the method described with reference to FIG. 2 by anyone skilled in the art. The LFSR implementation of the second embodiment is hereinafter described.

The figure shows corrupted code-word r(x) being fed into a division LFSR circuit 502 through a gate H1. Corrupted code-word r(x) is also fed to Buffer Stage 404 through a gate H2. The weights of the feedback connections in division LFSR circuit 502 are the coefficients of generator g(x); so as to achieve division by g(x). A gate H3 is used to enable or disable the feedback connections of division LFSR circuit 502 as required. The most significant bit of the contents of division LFSR circuit 502, $s_{n-k-1}$, is fed to the input of multiplication and division LFSR circuit 402 through a gate H4. A gate H5 is used to enable or disable the feedback connections of multiplication and division LFSR circuit 402 as required. The most significant bit of the contents of multiplication and division LFSR circuit 402, $S_{n-k-1}$, is fed to one of the inputs of error-correction modulo-2 adder 408 through a gate H6. The second input of error-correction modulo-2 adder 408 is taken from the output of Buffer Stage 404 through a gate H7. The output of error-correction modulo-2 adder 408 is fed to a gate H8, which outputs a decoded message-word m(x).

For the error-trapping operation, Zero Condition Checker 410 checks whether all the last n−k−b bits of syndrome S(x), $S_b$ to $S_{n-k-1}$, are zero. The result of this check is fed to a Second Control Logic 504 that controls the decoding process by turning gates H1 to H8 ON or OFF as explained hereinafter.

The first step of the decoding process involves computation of shortened syndrome s(x). For this, gates H1, H2 and H3 are turned ON while all other gates are turned OFF. Then, the first k−l bits of corrupted code-word r(x) are pushed into division LFSR circuit 502. At the same time, these bits are stored in Buffer Stage 404 through gate H2. Thereafter, gate H2 is turned OFF and the remaining n−k bits of corrupted code-word r(x) are pushed into division LFSR circuit 502. Once all the n−l bits of corrupted code-word r(x) have been pushed into division LFSR circuit 502, it contains the bits of shortened syndrome s(x), $s_0$ to $s_{n-k-1}$.

The second step of the decoding process involves the computation of syndrome S(x) using shortened syndrome s(x). For this, gate H3 is turned OFF and gates H4 and H5 are turned ON. Then, shortened syndrome s(x) is pushed from division LFSR circuit 502 to multiplication and division LFSR circuit 402 through gate H4. Once all the bits of shortened syndrome s(x) are pushed into multiplication and division LFSR circuit 402, it contains the bits of syndrome S(x).

The third step of the decoding process involves performing error-trapping using syndrome S(x). For this, gate H4 is turned OFF, and the contents of multiplication and division LFSR circuit 402 are checked by Zero Condition Checker 410. If all the n−k−b bits are not found to be zero by Zero Condition Checker 410, the contents of multiplication and division LFSR circuit 402 are cyclically right-shifted; the number of cyclic shift-operations is counted using shift_counter. After each cyclic right-shift operation, Zero Condition Checker 410 checks the new contents of multiplication and division LFSR circuit 402. The shifting and checking process is repeated till Zero Condition Checker 410 finds all the last n−k−b bits to be zero. This implies that the burst error is trapped in the first b bits of multiplication and division LFSR circuit 402. These b bits define burst-error E(x).

Thereafter, at the fourth stage of the decoding operation, error-correction is performed. For this, gate H5 is turned OFF and the b bits of burst-error E(x) are shifted to the last b bits of multiplication and division LFSR circuit 402. Then, the value of the shift_counter is used to identify the location of the corrupted bits in corrupted code-word r(x). For this, Second Control Logic 504 compares the value of the shift_counter with k−l.

If the value of the shift_counter is greater than k−l, it is concluded that the error has occurred in the parity bits of corrupted code-word r(x) and the bits of message-word m(x) in corrupted code-word r(x) are not corrupted. In this case, the contents of Buffer Stage 404 are identified as message-word m(x) and output through gate H8 by turning gates H7 and H8 ON.

However, if the value of the shift_counter is found to be less than k−1, the error is concluded to have occurred in the bits of message-word m(x) in corrupted code-word r(x). In this case, the first shift_counter number of bits of Buffer Stage 404 is identified as uncorrupted. These bits are output through gate H8 by turning gates H7 and H8 ON while keeping H6 OFF. After this gate H6 is turned on to correct the next b bits of Buffer Stage 404, or the remaining bits of Buffer Stage 404, whichever is lesser. The turning ON of gate H6 enables error-correction modulo-2 adder 408 to correct the bits of Buffer Stage 404 by performing modulo-2 addition of the bits of Buffer Stage 404 with burst-error E(x).

After the correction, gate H6 is turned OFF again, and the remaining bits, if any, in Buffer Stage 404 are pushed out through gates H7 and H8.

The DSP implementation of the second embodiment requires the division operation to be performed on a polynomial of size n−1, and simultaneous multiplication and division operations to be performed on a polynomial of size n−k. On the other hand, the implementation of the first embodiment of the present invention requires simultaneous division and multiplication operations to be performed on a polynomial of size n−1. Clearly, the second embodiment of the present invention requires fewer cycles than the first embodiment, when implemented using a DSP.

It would be apparent to anyone skilled in the art that the present invention may be embodied in a computer program product using either a processor specific assembly language or a high-level language such as C. The computer program product embodiment of the present invention can be used for either the implementation of a shortened cyclic code demodulator, or for implementation of a simulation model of the shortened cyclic code demodulator.

An advantage of the present invention is that it provides a method for syndrome calculation for decoding of shortened cyclic codes that is implemented with lesser hardware complexity than prior art methods. Further, the present invention provides a computationally efficient method of syndrome calculation for decoding of shortened cyclic codes.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A method of correcting errors in a corrupted code-word, the code-word encoded using a (n−l, k−l) shortened cyclic code for b bit burst error correction, the method comprising the steps of:
   a. multiplying the corrupted code-word with a syndrome-calculation polynomial, the syndrome-calculation polynomial being the remainder left on dividing a shift polynomial $x^l$ by the generator polynomial of the shortened cyclic code;
   b. calculating a syndrome corresponding to the corrupted code-word, the syndrome being calculated as the remainder left on dividing the product of the corrupted code-word with the syndrome-calculation polynomial by the generator polynomial of the shortened cyclic code;
   c. trapping a burst error pattern using the syndrome; and
   d. correcting the corrupted code-word using the burst error pattern.

2. The method according to claim 1, wherein the step a and the step b are executed simultaneously using an LFSR circuit.

3. The method according to claim 1, wherein the step of trapping the burst error comprises the sub-steps of:
   a. initializing a shift counter to zero;
   b. while at least one of the last n−k−b bits of the syndrome is non-zero and the shift counter is less than n−l, repeating the steps of:
   c. incrementing the shift counter by one; and
   d. right-shifting the syndrome cyclically by one position while using feedback;
   e. if the shift counter is not less than n−l, declaring that an uncorrectable error has occurred; and
   f. if all the last n−k−b bits of the syndrome are zero, identifying the first b bits of the syndrome as the burst error.

4. The method according to claim 1, wherein the step of correcting the corrupted code-word comprises the step of performing modulo-2 addition of the corrupted portion of the corrupted code-word and the burst error.

5. The method according to claim 1, wherein one or more of the steps are embodied in a computer program product.

6. A method of correcting errors in a corrupted code-word, the code-word encoded using a (n−l, k−l) shortened cyclic code for b bit burst error correction, the method comprising the steps of:
   a. calculating a shortened syndrome as the remainder left on dividing the corrupted code-word by the generator polynomial of the shortened cyclic code;
   b. multiplying the shortened syndrome with a syndrome-calculation polynomial, the syndrome-calculation polynomial being the remainder left on dividing a shift polynomial $x^l$ by the generator polynomial of the shortened cyclic code;
   c. calculating a syndrome corresponding to the corrupted code-word, the syndrome being the remainder left on dividing the product of the shortened syndrome and the syndrome-calculation polynomial by the generator polynomial of the shortened cyclic code;
   d. trapping a burst error pattern using the syndrome; and
   e. correcting the corrupted code-word using the burst error pattern.

7. The method according to claim 6, wherein the step of trapping the burst error comprises the sub-steps of:
   a. initializing a shift counter to zero;
   b. while at least one of the last n−k−b bits of the syndrome is non-zero and the shift counter is less than n−l, repeating the steps of:
   c. incrementing the shift counter by one; and
   d. right-shifting the syndrome cyclically by one position while using feedback;
   e. if the shift counter is not less than n−l, declaring that an uncorrectable error has occurred; and
   f. if all the last n−k−b bits of the syndrome are zero, identifying the first b bits of the syndrome as the burst error.

8. The method according to claim 6, wherein the step of correcting the corrupted code-word comprises performing modulo-2 addition of the corrupted portion of the corrupted code-word and the burst error.

9. The method according to claim 6, wherein one or more of the steps are embodied in a computer program product.

10. A system for performing error-correction on a corrupted code-word, the code-word encoded using a (n−1, k−1) shortened cyclic code for b bit burst error correction, the system comprising:
   a. a division circuit calculating a shortened syndrome using the corrupted code-word and the generator polynomial of the shortened cyclic code;
   b. a multiplication and division circuit calculating the syndrome using the shortened syndrome, the coefficients of a syndrome-calculation polynomial and the coefficients of the generator polynomial of the shortened cyclic code;
   c. a Zero Condition Checker checking whether all the last n−k−b bits of the contents of the multiplication and division circuit are zero;
   d. a Buffer Stage storing the first k−1 bits of the corrupted code-word;
   e. a error-correcting modulo-2 adder correcting the contents of the Buffer Stage using the contents of the multiplication and division circuit; and
   f. a Second Control Logic synchronizing the division circuit, the multiplication and division circuit, the Zero Condition Checker, the Buffer Stage and the error-correcting modulo-2 adder.

11. The system according to claim 10, wherein the multiplication and division circuit is implemented using a multiplication and division LFSR circuit.

12. The system according to claim 10 further comprising a gate for receiving the corrupted code-word and transferring the corrupted code-word to the division circuit.

13. The system according to claim 10 further comprising a gate for receiving the corrupted code-word and transferring the corrupted code-word to the buffer- stage.

14. The system according to claim 10 further comprising a gate for enabling and disabling the feedback connections of the division circuit.

15. The system according to claim 10 further comprising a gate for receiving contents of the division circuit and transferring the contents of the division circuit to the multiplication and division circuit.

16. The system according to claim 10 further comprising a gate for enabling and disabling the feedback connections of multiplication and division circuit 17. The system according to claim 10 further comprising a gate for receiving contents of multiplication and division circuit, and transferring the contents of the multiplication and division circuit to the error-correction modulo-2 adder.

18. The system according to claim 10 further comprising a gate for receiving contents of the buffer stage and transferring the contents to the error-correction modulo-2 adder.

19. The system according to claim 10 further comprising a gate for receiving a decoded message-word from the error-correction modulo-2 adder.

20. The system according to claim 10 further comprising a shift counter for counting the number of cyclic shift-operations in the multiplication and division circuit.

* * * * *